United States Patent
Cho

(10) Patent No.: US 7,551,479 B2
(45) Date of Patent: Jun. 23, 2009

(54) SETTING FAIL BIT VERIFICATION CIRCUIT WITH DIFFERENT REFERENCE FAIL NUMBERS AND A NON-VOLATILE SEMICONDUCTOR MEMORY DEVICE INCLUDING THE SAME

(75) Inventor: Ji Ho Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 252 days.

(21) Appl. No.: 11/592,151

(22) Filed: Nov. 3, 2006

(65) Prior Publication Data

US 2007/0159890 A1 Jul. 12, 2007

(30) Foreign Application Priority Data

Jan. 6, 2006 (KR) .................. 10-2006-0001803

(51) Int. Cl.
*G11C 16/06* (2006.01)
(52) U.S. Cl. .................. 365/185.09; 365/185.22; 365/185.29
(58) Field of Classification Search .......... 365/185.09, 365/185.17, 185.22, 185.29
See application file for complete search history.

(56) References Cited

U.S. PATENT DOCUMENTS 5,954,828 A * 9/1999 Lin ..................... 714/723
7,230,852 B2 * 6/2007 Mitani et al. ........... 365/185.18

FOREIGN PATENT DOCUMENTS

| KR | 1020000047814 A | 7/2000 |
| KR | 1020000060206 A | 10/2000 |
| KR | 1020010011482 A | 2/2001 |
| KR | 1020020032171 A | 5/2002 |
| KR | 1020020043378 A | 6/2002 |
| KR | 1020030071630 A | 9/2003 |
| KR | 100445794 B1 | 8/2004 |

* cited by examiner

*Primary Examiner*—Hoai V Ho
(74) *Attorney, Agent, or Firm*—Volentine & Whitt, PLLC

(57) ABSTRACT

A reference fail bit verification circuit includes a fail bit counter which counts a number of fail bits to generate a first counting signal and a second counting signal, the first counting signal and the second counting signal being activated in response to the number of fail bits counted. The circuit also includes a bit verification block which generates a reference bit verification signal that is activated in response to a transition of the first counting signal and the second counting signal, wherein the reference bit verification signal is activated in response to at least one of the activation of the first counting signal in a first mode, and the activation of the second counting signal in a second mode.

14 Claims, 10 Drawing Sheets

SETTING FAIL BIT VERIFICATION CIRCUIT WITH DIFFERENT REFERENCE FAIL NUMBERS AND A NON-VOLATILE SEMICONDUCTOR MEMORY DEVICE INCLUDING THE SAME

BACKGROUND OF THE INVENTION

1. Field of the Invention

The present invention relates to a non-volatile semiconductor memory device and, more particularly, to a reference fail bit verification circuit in a non-volatile semiconductor memory device that checks for un-erased memory cells A claim of priority is made to Korean Patent Application No. 10-2006-1803 filed on Jan. 6, 2006, the disclosure of which is hereby incorporated by reference in its entirety.

2. Description of the Related Art

In non-volatile semiconductor memory devices, the data programmed in the memory cells of a unit block is simultaneously erased during the erase operation. The erase operation generally includes two processes—an erasing process and an erase verifying process. In the erasing process, the trapped charges in the floating gate of the memory cell are returned to the bulk by the potential difference between the control gate and the bulk of the memory cell. In the erase verifying process, a verification is made as to whether the data of the memory cells is erased or not. The erase verifying process usually uses a fail bit number and a reference fail number to determine whether the memory cells have been satisfactorily erased.

For example, if the fail bit number is equal to or more than the reference fail number, the erasing process is repeated. In this specification, the 'fail bit number' means the number of memory cells that are not erased despite the performance of the erasing process.

The erase operation can be divided into two modes. In the first mode, if it is detected in the erase verifying process that the 'fail bit number' is equal to or more than the 'reference fail number', the voltage induced in the bulk is increased in steps during the erasing process. On the other hand, in the second mode, if it is detected in the erase verifying process that the fail bit number is equal to or more than the reference fail number, the voltages of the bulk and the control gate are maintained at a constant level in the erasing process.

Meanwhile, as is well known to one skilled in the art, the non-volatile semiconductor memory device includes a reference fail bit verification circuit to check whether the fail bit number is equal to or more than the reference fail number.

FIG. 1 is a block diagram showing a conventional reference fail bit verification circuit 10. Referring to FIG. 1, a fail bit counter 12 counts fail bits (i.e., un-erased memory cells) with a fail check signal XFUR At this time, when the amount of fail bits equals the reference fail number, a counting signal FCNT<i> is activated. Furthermore, a fail bit verification latch unit 14 generates a reference bit verification signal VLTF by latching the counting signal FCNT<i>.

While the conventional reference fail bit verification circuit may be used to determine whether the fail bit number is equal to or more than the reference fail number, it has several shortcomings. For example, in the conventional reference fail bit verification circuit 10, the reference bit verification signal VLTF is activated in response to the activation of the counting signal FCNT<i>. That is, in the conventional reference fail bit verification circuit 10, the reference fail number is set as one value without considering the type of mode used in the erase operation. Setting the reference fail number irrespective of the mode of erase operation used may lead to a number of problems.

For example, when the reference fail number is set as one value without considering the kind of mode, as described above, the overall time required to perform the erase operation may be very long. That is, when the reference fail number is set high, the time required for one erase cycle may be short but because a number of memory cells may not have been properly erased, the erase distribution may become worse.

On the other hand, if the reference fail bit number is set low, the erase distribution may be improved. However, some of memory cells may be over-erased. This over-erasure of some of the memory cells may increase the post-program time. Thus, the overall erase time is increased.

As described above, it may be difficult to set the reference fail number appropriately in the conventional reference fail bit verification circuit. This may lead to an overall increase in the time taken for an erase operation of the memory cells in a semiconductor device.

The present disclosure is directed towards overcoming one or more problems associated with the conventional reference fail bit verification circuit.

SUMMARY OF THE INVENTION

One aspect of the present disclosure includes a reference fail bit verification circuit. The circuit includes a fail bit counter which counts a number of fail bits to generate a first counting signal and a second counting signal, the first counting signal and the second counting signal being activated in response to the number of fail bits counted. The circuit also includes a bit verification block which generates a reference bit verification signal that is activated in response to a transition of the first counting signal and the second counting signal, wherein the reference bit verification signal is activated in response to at least one of the activation of the first counting signal in a first mode, and the activation of the second counting signal in a second mode.

Another aspect of the present disclosure includes a non-volatile semiconductor memory device. The device includes a memory array including a plurality of non-volatile memory cells. The device also includes a fail bit detection circuit which generates a fail check signal in response to a detection of a fail bit corresponding to a an un-erased non-volatile memory cell in the memory array. The device also includes a reference fail bit verification circuit which counts the detected fail bit with the fail check signal to generate a reference bit verification signal, wherein the reference bit verification signal is activated in response to the detection of a fail bit of a first reference fail number and a fail bit of a second reference fail number in a first mode and a second mode, respectively. The device also includes a high voltage generating circuit which provides an erase voltage to the memory array to erase the non-volatile memory cells, wherein the erase voltage is controlled by the reference bit verification signal.

BRIEF DESCRIPTION OF THE DRAWINGS

The features of the present invention will be more clearly understood from the following detailed description taken in conjunction with the accompanying drawings, in which.

DETAILED DESCRIPTION OF EXEMPLARY EMBODIMENTS

Before describing exemplary embodiments of a reference fail bit verification circuit, a conventional erase operation will first be described with reference to FIGS. 2 and 3.

Generally, a plurality of memory cells in a non-volatile semiconductor memory device are simultaneously erased in units that may be measured in terms of a sector or a block. A mechanism that is commonly used for such an erasing procedure is the so-called Fowler-Nordheim tunneling mechanism.

Figure 1:
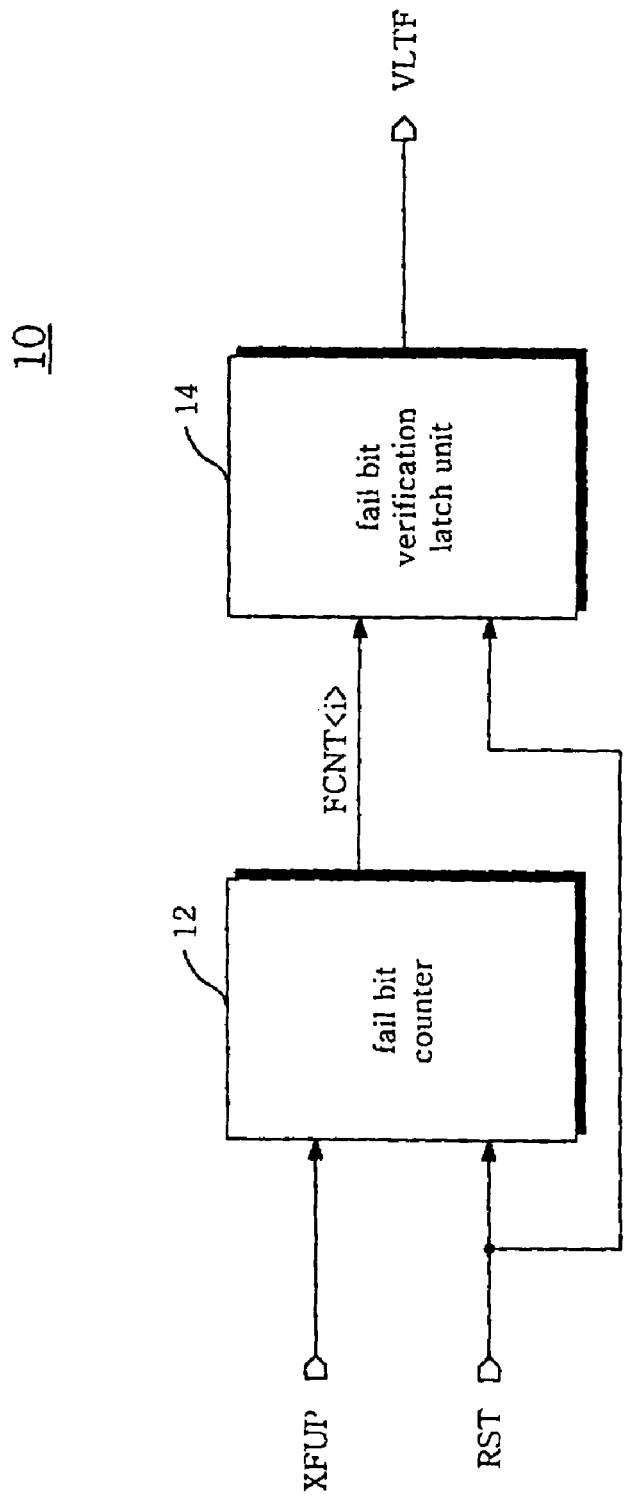
FIG. 1 is a block diagram showing a conventional reference fail bit verification circuit.
Figure 2:
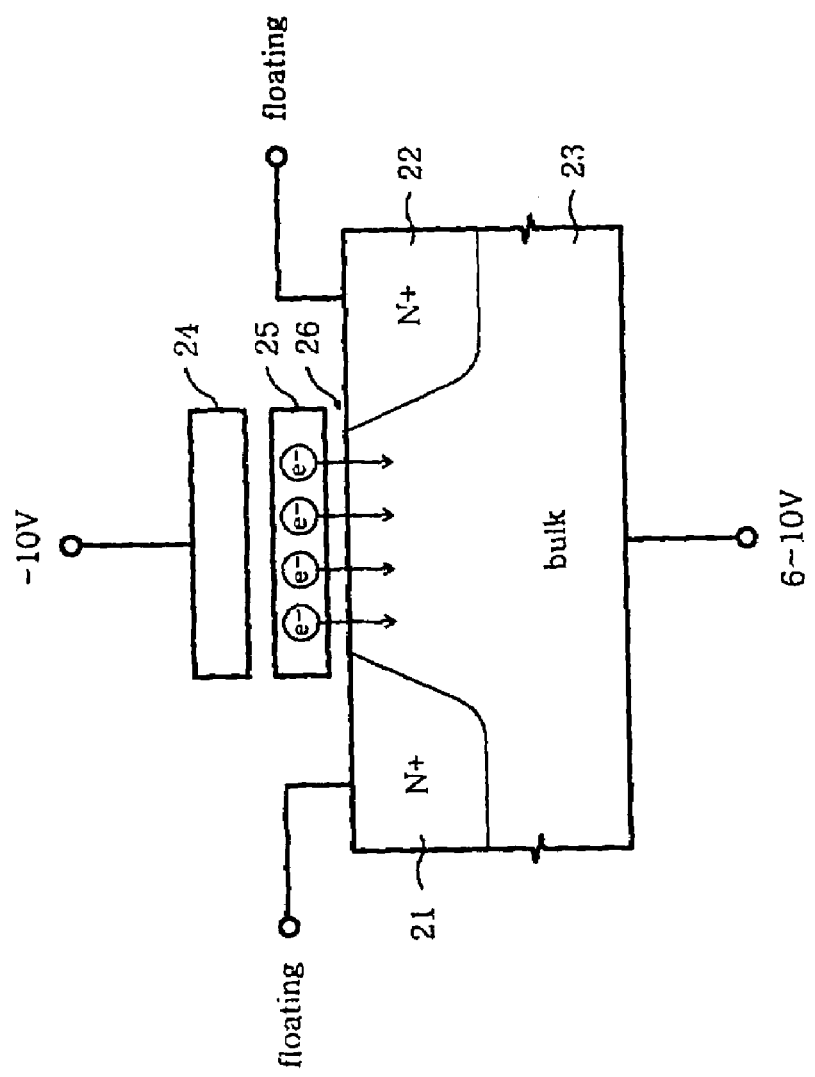
FIG. 2 is a diagram illustrating voltage states applied in each node of a memory cell during the erase operation.
Figure 3:
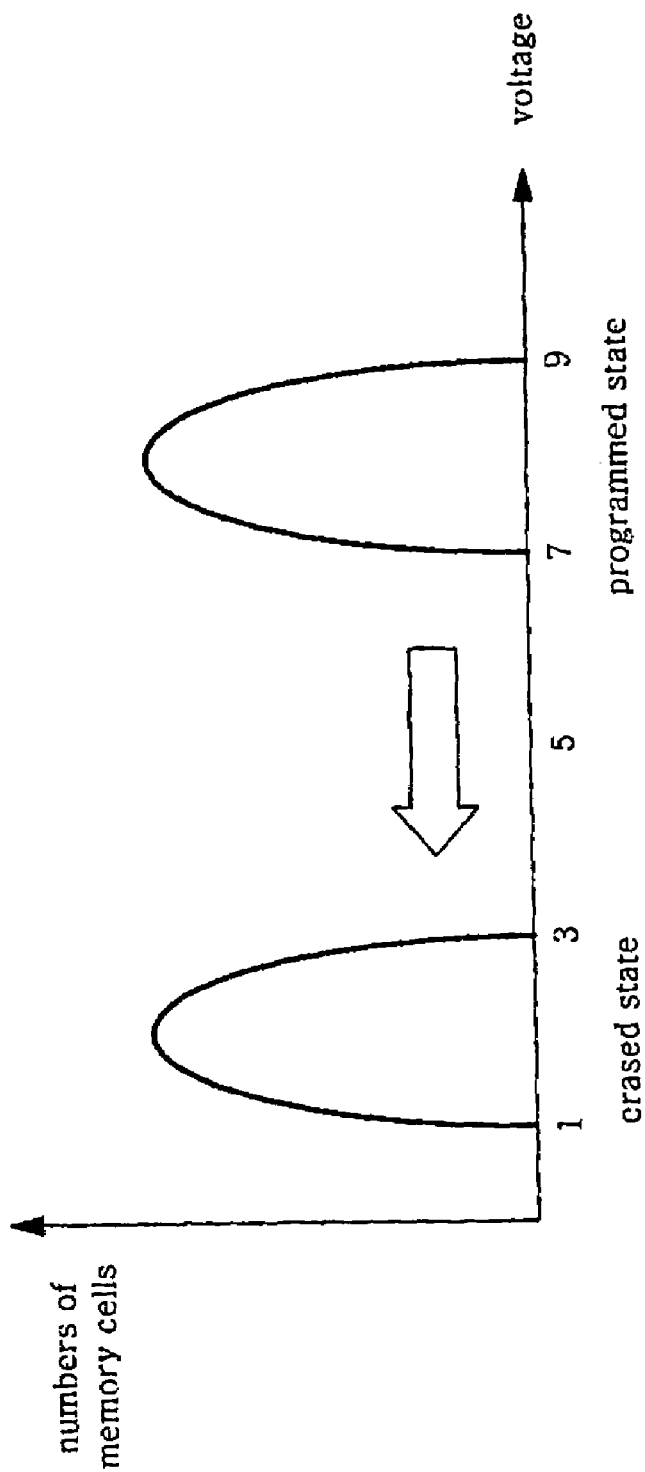
FIG. 3 is a diagram illustrating the change in the threshold voltage of memory cell according to a conventional erase operation.

FIG. 2 is a diagram for explaining voltage states applied to each node of a memory cell during an erase operation. First, a negative high voltage (e.g., −10V) is applied to the control gate 24 and a positive voltage (e.g., 5V to 10V) is applied to the bulk 23. At this time, the source and drain regions 21, 22 of the memory cell are maintained at a floating state. With such a bias condition, a strong electric field is formed between the control gate 24 and the bulk 23, which results in Fowler-Nordheim tunneling. That is, the negative charges trapped in the floating gate 25 move to the bulk 23 across a dielectric film 26. This movement of the negative charges from the floating gate 25 to the bulk 23 causes the threshold voltage distributions of the memory cell to change. For example, as shown in FIG. 3, the voltage distributions change from that of the programmed state (e.g. 7V~9V) to that of the erased state (e.g. 1V~3V).

After the erase operation is executed, an erase verifying process is performed. The erase verifying process may be used to check whether the threshold voltage of each memory cell is changed into a target threshold voltage range. If the threshold voltage in a memory cell is out of the target threshold range, the memory cell is deemed to be in an un-erased state. At this time, the erase operation is re-executed for the un-erased memory cell.

Figure 4:
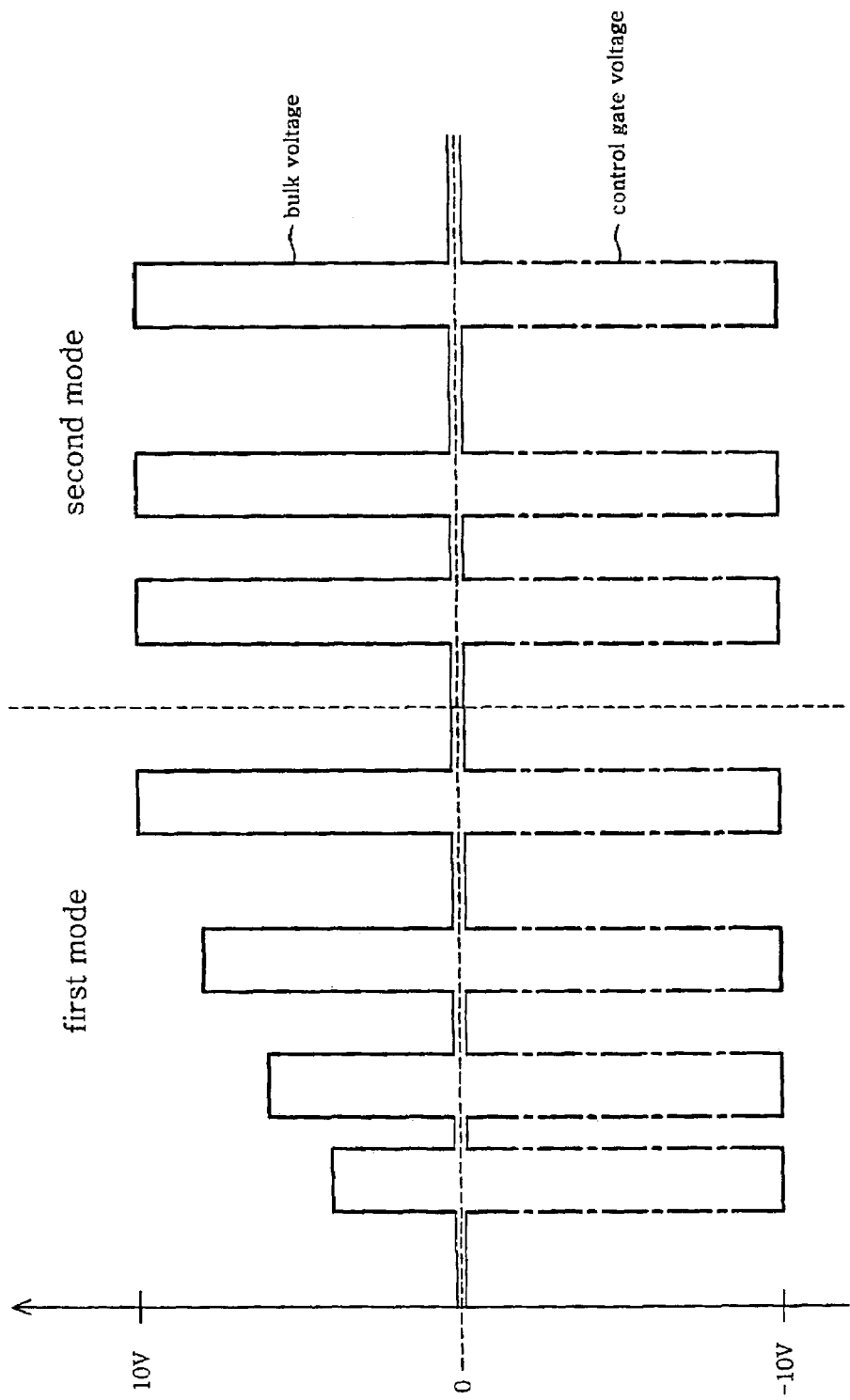
FIG. 4 is a diagram illustrating a change in the bulk voltage of a memory cell in an erase operation according to an exemplary disclosed embodiment of the present invention.

FIG. 4 is a drawing that illustrates the change in the bulk voltage of a memory cell according to an exemplary disclosed embodiment. Referring to FIG. 4, after the erase verifying process is executed, the erase operation may be performed in two modes. These two modes may be known as a first mode and a second mode. In the erase operation of a first mode, the control gate of memory cell is applied with a voltage of about −10V. During this time, the voltage levels applied to the bulk is increased step by step. On the other hand, in the erase operation of a second mode, a voltage of about −10v is applied to the control gate of memory cell and a voltage level of about 10V is applied to the bulk. Furthermore, unlike the first mode, the voltage applied to the bulk is kept at a constant level. In addition, in the erase operation of a second mode, the inducing time of the voltage is increased step by step.

Reference will now be made to the drawings, in which the same reference numerals are used throughout the different drawings to designate the same or similar components. In the following description of the exemplary embodiments, detailed descriptions may be omitted if it is determined that the detailed descriptions of related well-known functions and construction may make the gist of the disclosed embodiments unclear.

Hereinafter, exemplary embodiments will be described in detail with reference to the attached drawings.

Figure 5:
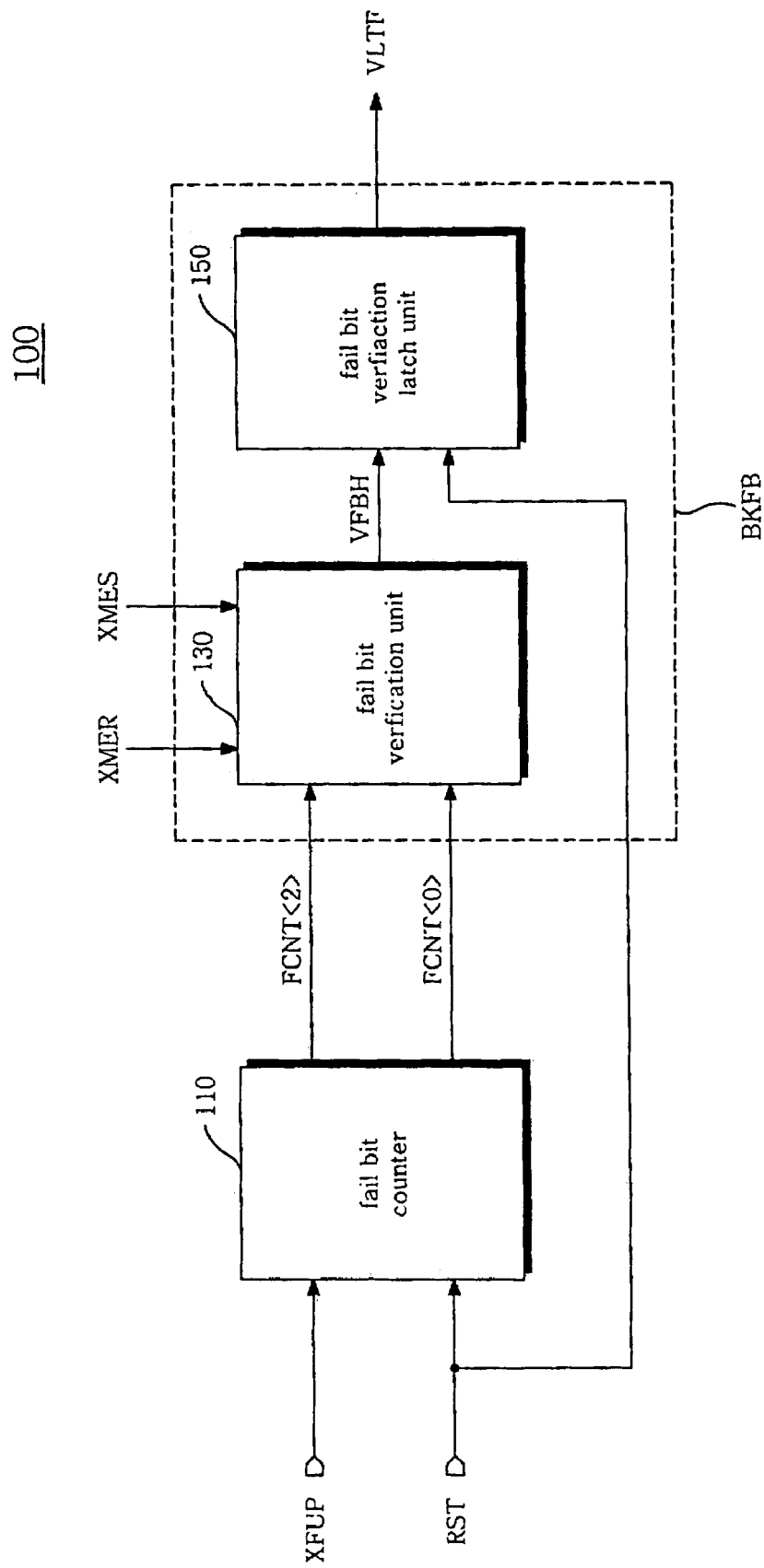
FIG. 5 is a block diagram illustrating a reference fail bit verification circuit according to an exemplary disclosed embodiment of the present invention.

FIG. 5 is a block diagram showing a reference fail bit verification circuit 100 according to an exemplary disclosed embodiment. Referring to FIG. 5, a reference fail bit verification circuit 100 includes a fail bit counter 110 and a bit verification block BKFB.

The fail bit counter 110 counts the number of detected fail bits. In addition, the fail bit counter 110 generates a first counting signal FCNT<2> and a second counting signal FCNT<0> based on the number of fail bits detected. For example, the first counting signal FCNT<2> and the second counting signal FCNT<0> are activated to a logic "H" in response to the detection of the fail bits of 'a first fail number' and 'a second fail number', respectively.

Figure 6:
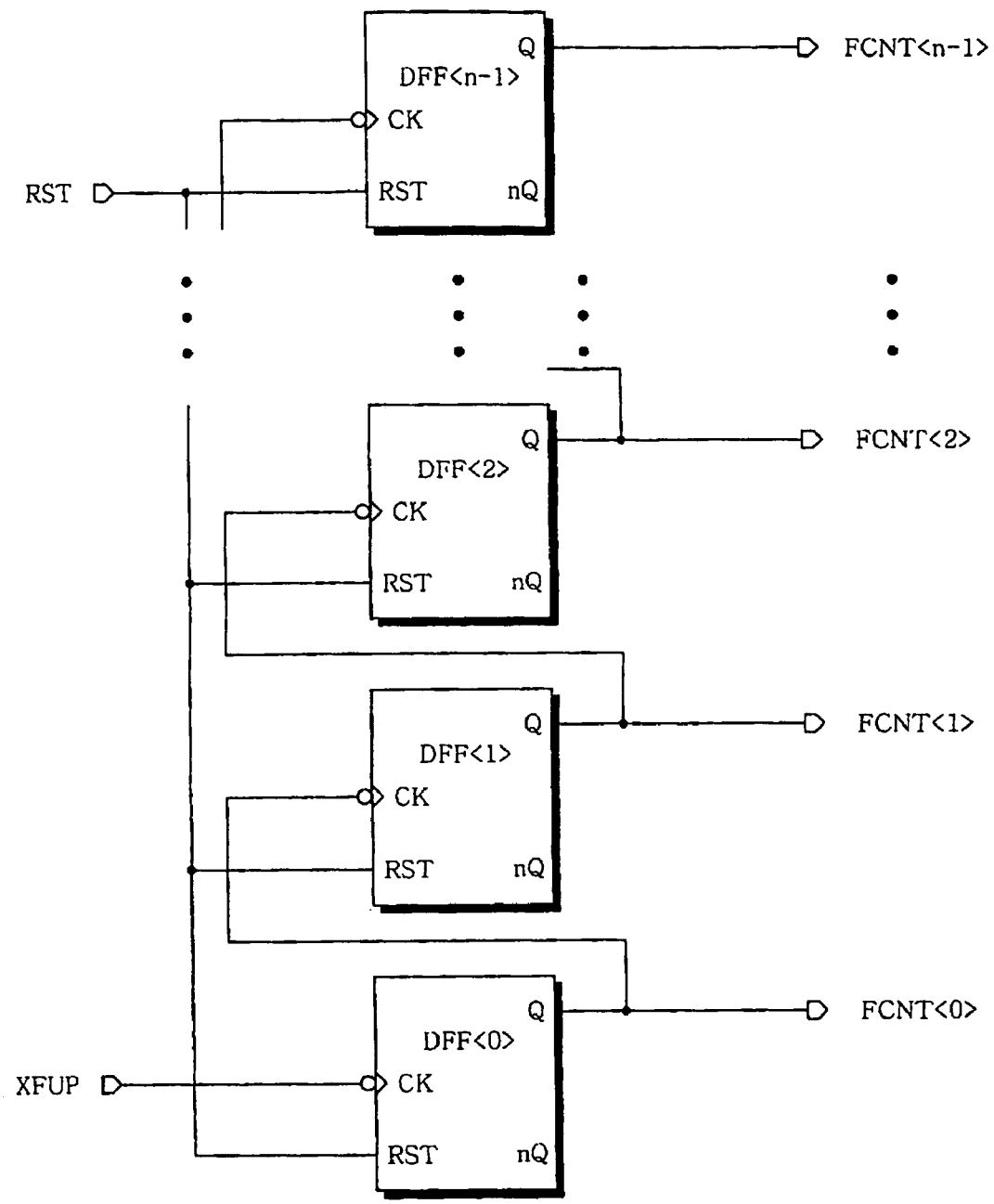
FIG. 6 is a diagram showing an example of the fail bit counter shown in FIG. 5.

FIG. 6 is a diagram showing an example of the fail bit counter 110 shown in FIG. 5. Referring to FIG. 6, the fail bit counter 110 includes a plurality of D flip-flops DFF<n-1:0>. In an exemplary embodiment, the output signal of each D flip-flop DFF<n-1:0> is input to the clock terminal of the following D flip-flop. In addition, a fail check signal XFUP is applied to the clock terminal of the first D flip-flop DFF<0>.

Figure 7:
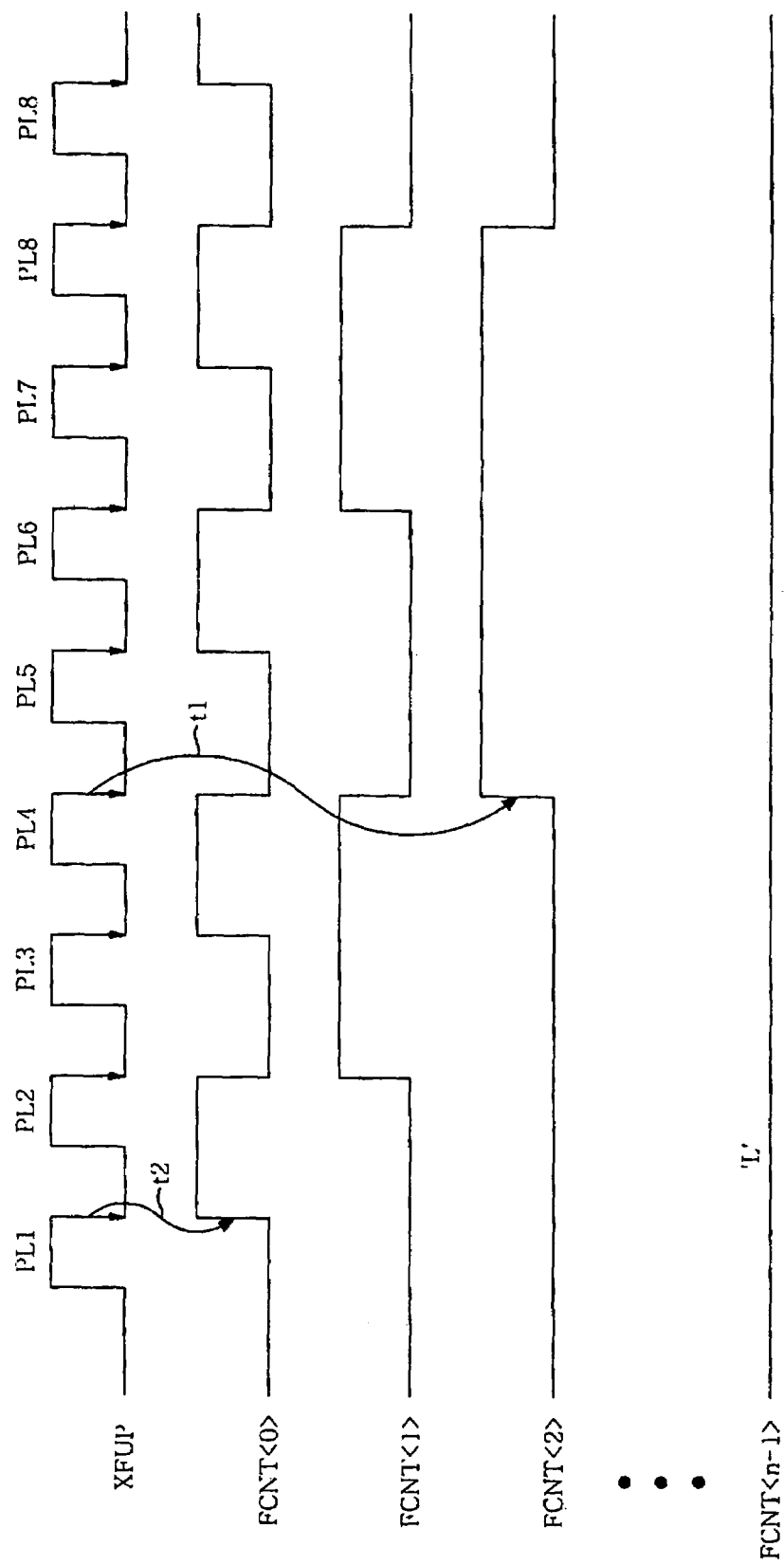
FIG. 7 is a diagram illustrating an operation of the fail bit counter shown in FIG. 6.

FIG. 7 is a diagram illustrating an operation of the fail bit counter 110 shown in FIG. 6. In an exemplary embodiment, as shown in FIG. 7, the fail check signal (XFUP) is a signal which is generated as a pulse form in response to the detection of non-erased memory cells, i.e., the fail bits. Still referring to FIG. 7, the first counting signal FCNT<2> is activated in response to the inactivation of the fourth pulse of the fail check signal XFUP at time t1. In other words, the first counting signal FCNT<2> is activated in response to the detection of the fourth fail bit.

Furthermore, the second counting signal FCNT<0> is activated in response to the inactivation of the first pulse PL1 of the fail check signal XFUP at time t2. In other words, the first counting signal FCNT<0> is activated in response to the first fail bit.

Referring back to FIG. 5, the bit verification block BKFB receives the first counting signal FCNT<2> and the second counting signal FCNT<0>, and generates a reference bit verification signal VLTF. The reference bit verification signal VLTF is activated to "H" in response to the transition of the first counting signal FCNT<2> and the transition of the second counting signal FCNT<0>.

Specifically, when the erase operation operates in the first mode, a first mode selection signal XMER is activated to logic "H". In addition, the reference bit verification signal VLTF is activated to "H" in response to the activation of the first counting signal FCNT<2>. Likewise, when the erase operation operates in the second mode, a second mode selection signal XMES is activated to logic "H". Furthermore, the reference bit verification signal VLTF is activated to "H" in response to the activation of the second counting signal FCNT<0>.

In an exemplary embodiment, the bit verification block BKFB includes a fail bit verification unit 130. The fail bit verification unit 130 generates a setting bit verification signal VFBH. In particular, the setting bit verification signal VFBH is activated in response to the transition of the first counting signal FCNT<2> and the transition of the second counting signal FCNT<0>.

Figure 8:
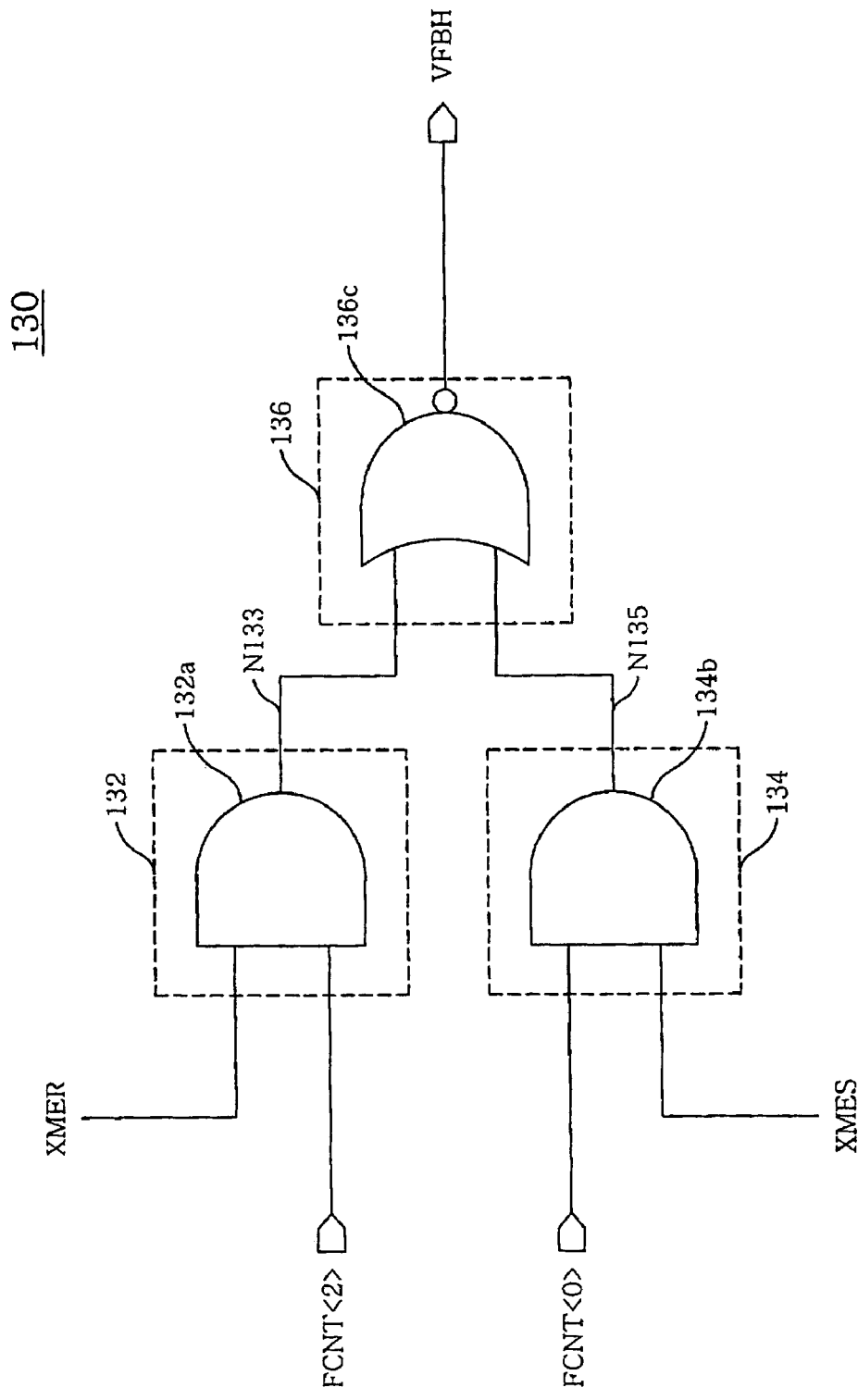
FIG. 8 is a diagram illustrating the fail bit verification unit of FIG. 5.

FIG. 8 is a diagram illustrating the fail bit verification unit 130 of FIG. 5. Referring to FIG. 8, the fail bit verification unit 130 includes a first logic circuit 132, a second logic circuit 134 and a third logic circuit 136.

The first logic circuit 132 is configured such that it is enabled in a first mode when the selection signal XMER is activated to a logic "H". In particular, the first logic circuit 132 generates an output signal N133 in response to the activation of the first counting signal FCNT<2>. Beneficially, the first logic circuit 132 is an AND gate 132a having two input signals. One input signal is the first mode selection signal XMER and the other input signal is the first counting signal FCNT<2>. As described above, the first counting signal FCNT<2> is activated in response to the detection of 'a first fail number' and to the detection of the fourth fail bit of XFUP. Therefore, the output signal N133 of the first logic circuit 132 is activated to logic "H" in response to the detection of the fourth fail bit of the first reference fail number.

As mentioned above, when the erase operation operates in the second mode the second mode selection signal XMES is activated to logic "H". Furthermore, at this time the second logic circuit 134 is enabled. Furthermore, the second logic circuit 134 generates an output signal N135 in response to the activation of the second counting signal FCNT<0>. Beneficially, the second logic circuit 134 is an AND gate 134b having two input signals. One input signal is the second mode selection signal XMES and the other signal is the second counting signal FCNT<0>. As described above, the second counting signal FCNT<2> is activated in response to the detection of 'a second fail number' and to the detection of the first fail bit of XFUP. Therefore, the output signal N135 of the second circuit 134 is activated to logic "H" in response to the detection of the first fail bit of the second reference fail number.

The third logic circuit 136 performs a logical sum operation on the output signal N133 of the first logic circuit 132 and the output signal N135 of the second logic circuit 134. Preferably, the third logic circuit 136 is a NOR gate 136c having two input signals. One input signal is the output signal N133 of the first logic circuit 132 and the other input signal is the output signal N135 of the second logic means 134. The third logic circuit 136 outputs the setting bit verification signal VFBH.

Therefore, in the first mode, the setting bit verification signal VFBH is activated to logic "H" in response to the activation of the first counting signal FCNT<2>. Likewise, in the second mode, the setting bit verification signal VFBH is activated to a logic "H" state in response to the activation of the second counting signal FCNT<0>.

Referring to FIG. 5 again, the bit verification block BKFB further includes a fail bit verification latch unit 150. In an exemplary embodiment, the fail bit verification latch unit receives two input signals. One input signal is the setting bit verification signal VFBH and the other input signal is the reset signal RST. The fail bit verification latch unit 150 generates the reference bit verification signal VLTF by latching the setting bit verification signal VFBH. At this time, the fail bit verification unit 150 is initialized in response to a reset signal RST.

Figure 9:
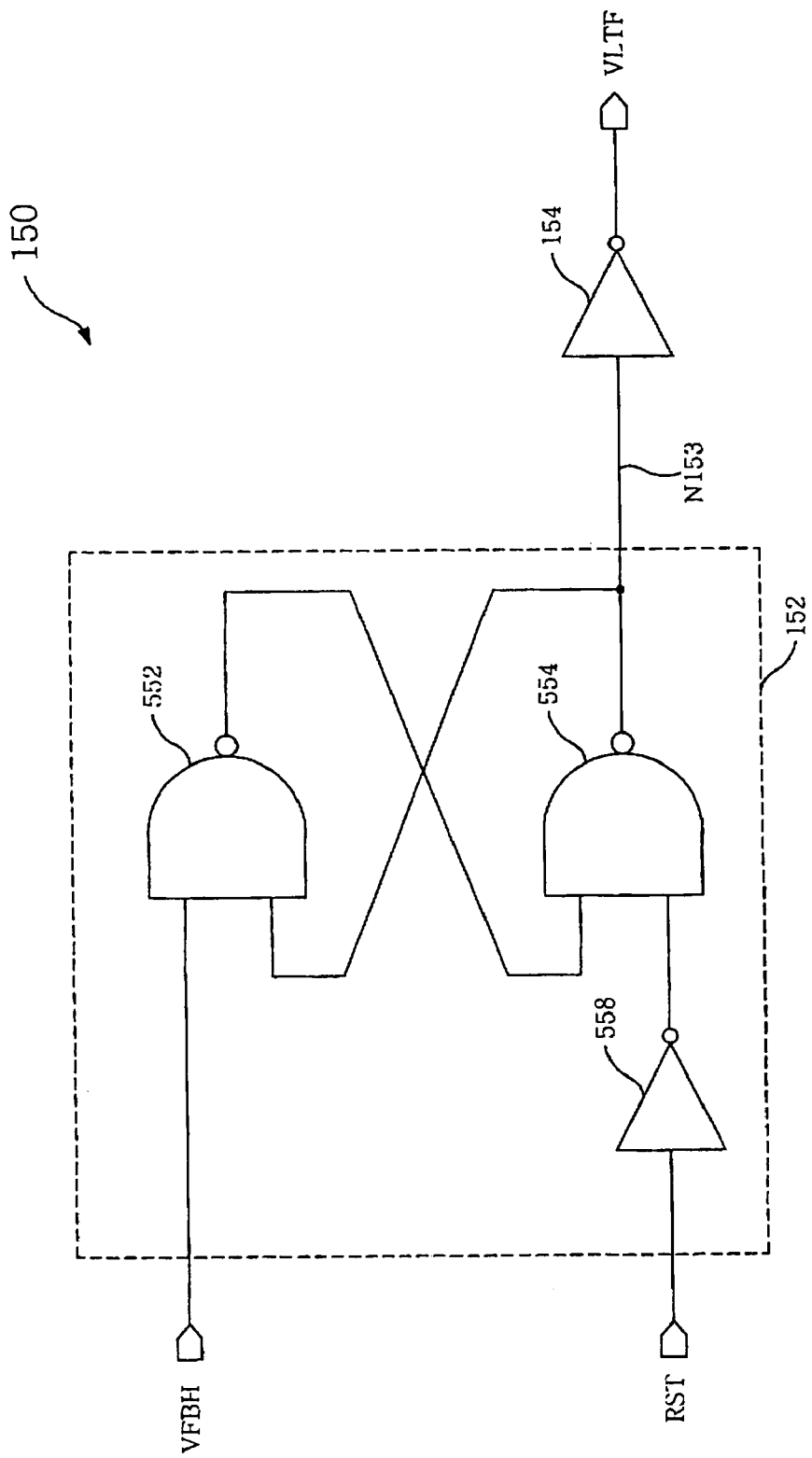
FIG. 9 is a diagram illustrating in detail the fail bit verification latch unit of FIG. 5.

FIG. 9 is a diagram illustrating in detail the fail bit verification latch unit 150 in FIG. 5. Referring to FIG. 9, the fail bit verification latch unit 150 includes a latching circuit 152 and a buffering circuit 154. As shown in FIG. 9, the latching circuit 152 may include a combination of gates such as, for example, NAND gates and NOT gates. The latching circuit 152 receives two input signals. These signals include the reset signal RST and the setting bit verification signal VFBH. In addition, the latching circuit 152 generates an output signal N153. In an exemplary embodiment, the latching circuit 152 is reset in response to the reset signal RST. Furthermore, the output signal N153 of the latching circuit 152 is activated to logic "H" in response to the activation of the setting bit verification signal VFBH.

The buffering circuit 154 generates the reference bit verification signal VLTF by buffering the output signal N153 of the latching circuit 152. As shown in FIG. 9, the buffering circuit 154 may include a NOT gate.

Thus the fail bit verification circuit 100 of an exemplary disclosed embodiment permits the setting of different reference fail numbers for the first and second modes of erase operations in a memory cell respectively. For example, when the first mode of erase operation is used, the fail bit number is set to '4'. Alternatively, when the second mode of erase operation is used, the fail bit number is set to '1'. In other words, for the first mode, the reference fail bit number is set relatively large so that the time required for erase operation may be shortened. On the other hand, for the second mode, the reference fail bit number is set relatively small so that the number of non-erased memory cells may be minimized.

Figure 10:
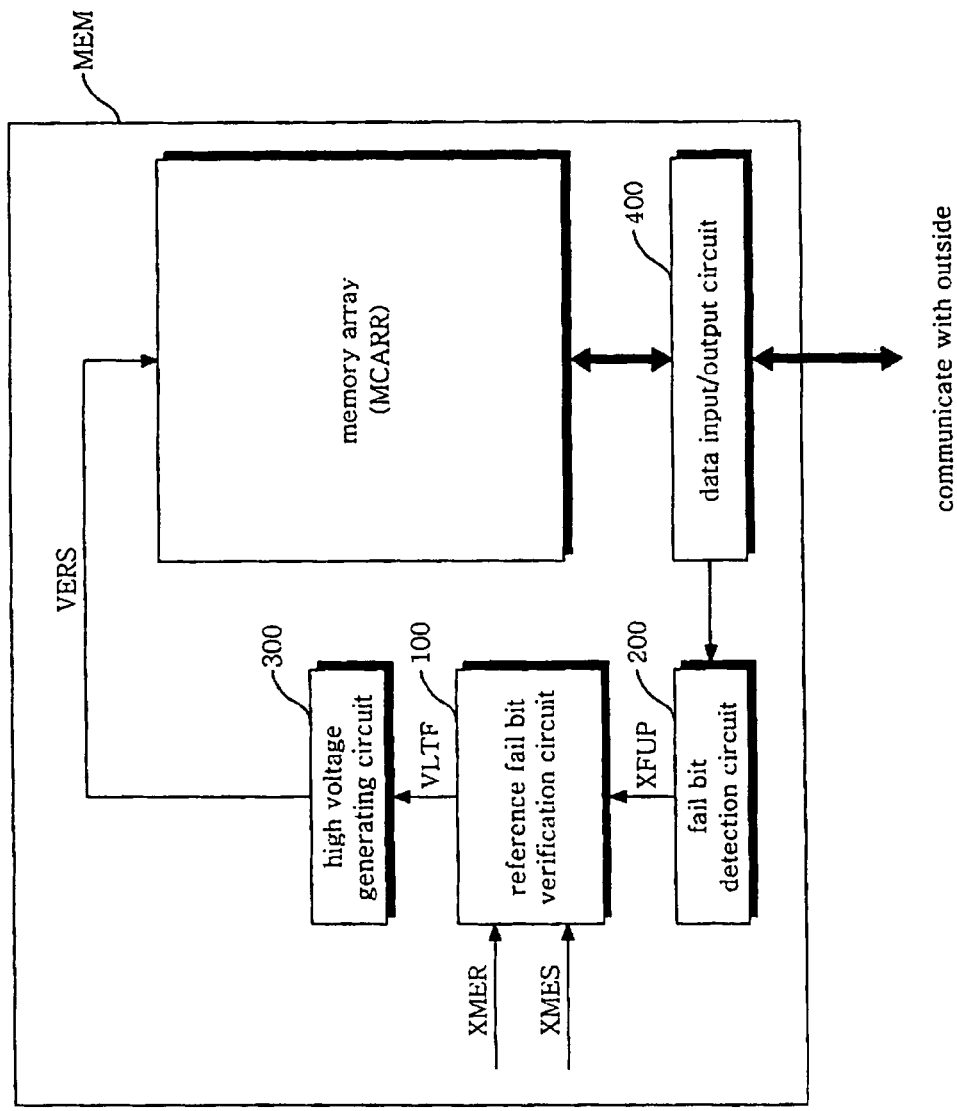
FIG. 10 is a block diagram illustrating a non-volatile semiconductor memory device MEM according to an exemplary disclosed embodiment of the present invention.

FIG. 10 is a block diagram illustrating a non-volatile semiconductor memory device MEM according to an exemplary disclosed embodiment of the present invention. The non-volatile semiconductor memory device MEM comprises a memory array MCARR, the reference fail bit verification circuit 100, a fail bit detection circuit 200, and a high voltage generating circuit 300. The memory array MCARR includes a plurality of non-volatile memory cells.

The fail bit detection circuit 200 generates the fail check signal XFUP. Specifically, the fail bit detection circuit 200 generates the fail check signal XFUP based on the number of fail bits i.e., the number of un-erased un-volatile memory cells in the memory array MCARR.

The reference fail bit verification circuit 100 counts the number of fail bits detected in accordance with the fail check signal XFUP. Furthermore, the reference fail bit verification circuit 100 generates the reference bit verification signal VLTF. As described above, the reference bit verification signal VLTF is activated in response to the detection of the fail bit of the first reference fail number and the fail bit of the second reference fail number in a first mode and a second mode, respectively.

The high voltage generating circuit 300 provides an erase voltage VERS to the memory array MCARR, so as to erase the non-volatile memory cells (not shown). The erase voltage VERS is controlled by the reference bit verification signal VLTF. In other words, if the erase operation is carried out in the first mode, the level of the erase voltage VERS is increased step by step in response to the activation of the reference bit verification signal VLTF. In contrast, if the erase operation is carried out in the second mode, the level of the erase voltage VERS is maintained at the same level as that in the prior step.

The data input-output circuit 400 controls the input-output of data from/to the memory array MCARR. For example, the data input-output circuit 400 provides read data to the fail bit detection circuit 200.

The disclosed reference fail bit verification system can be used in any non volatile semiconductor memory device. By being able to set different reference fail numbers for different erase operation modes, the disclosed system may reduce the erasure time for non volatile memory cells. Furthermore, this ability to set different reference fail numbers may also prevent over erasure of the memory cells.

Although exemplary embodiments have been disclosed for illustrative purposes, those skilled in the art will appreciate that various modifications, additions and substitutions are possible, without departing from the scope and spirit of the invention as disclosed in the accompanying claims. Therefore, the technical scope of the present invention should be defined by the technical spirit of the accompanying claims and their equivalents.

What is claimed is:

1. A reference fail bit verification circuit, comprising:
    a fail bit counter which counts a number of fail bits in response to a fail check signal to generate a first counting signal and a second counting signal, the first counting signal and the second counting signal being activated in response to detecting the first reference fail bit and the second reference fail bit, respectively, wherein the first reference fail number and the second reference fail number are different, and the fail check signal is generated as a pulse upon detection of a fail bit; and
    a bit verification block which generates a reference bit verification signal that is activated in response to a transition of the first counting signal and the second counting signal, wherein the reference bit verification signal is activated in response to at least one of the activation of the first counting signal in a first mode, and the activation of the second counting signal in a second mode.

2. The reference fail bit verification circuit of claim 1, wherein the bit verification block comprises:
    a fail bit verification unit which generates a setting bit verification signal, the setting bit verification signal being activated in response to a transition of the first counting signal or the second counting signal, wherein the setting bit verification signal is activated in response to at least one of the activation of the first counting signal in the first mode and the activation of the second counting signal in the second mode.

3. The reference fail bit verification circuit of claim 2, wherein the fail bit verification unit comprises:
    a first logic circuit which is enabled in the first mode, wherein the first logic circuit generates an output signal in response to the activation of the first counting signal;
    a second logic circuit which is enabled in the second mode, wherein the second logic circuit generates an output signal in response to the activation of the counting signal; and
    a third logic circuit which performs a logic operation on the output signal of the first logic circuit and the output signal of the second logic circuit.

4. The reference fail bit verification circuit of claim 3, wherein the first logic circuit is a first AND gate which performs an AND operation on a first mode selection signal being enabled in the first mode and the first counting signal, and
    wherein the second logic circuit is a second AND gate which performs an AND operation on a second mode selection signal being enabled in the second mode and the second counting signal.

5. The reference fail bit verification circuit of claim 2, wherein the bit verification block further comprises a fail bit verification latch unit which generates a reference bit verification signal by latching the setting bit verification signal.

6. The reference fail bit verification circuit of claim 5, wherein the fail bit verification latch unit is initialized in response to a reset signal.

7. The reference fail bit verification circuit of claim 6, wherein the fail bit verification latch unit comprises a latching circuit which is reset in response to the reset signal, wherein the latching circuit generates an output signal in response to the bit verification signal.

8. The reference fail bit verification circuit of claim 7, wherein the fail bit verification latch unit further comprises a buffering circuit which buffers the output signal of the latching circuit to generate the reference bit verification signal.

9. A non-volatile semiconductor memory device, comprising:
    a memory array including a plurality of non-volatile memory cells;
    a fail bit detection circuit which generates a fail check signal in response to a detection of a fail bit corresponding to a un-erased non-volatile memory cell in the memory array, wherein the fail check signal is generated as a pulse upon detection of a fail bit;
    a reference fail bit verification circuit which counts the detected fail bit with the fail check signal to generate a reference bit verification signal, wherein the reference bit verification signal is activated in response to the detection of a fail bit of a first reference fail number and a fail bit of a second reference fail number in a first mode and a second mode, respectively, wherein the first reference fail number and the second reference fail number are different; and
    a high voltage generating circuit which provides an erase voltage to the memory array to erase the non-volatile memory cells, wherein the erase voltage is controlled by the reference bit verification signal.

10. The non-volatile semiconductor memory device of claim 9, wherein the reference fail bit verification circuit comprises:
    a fail bit counter which counts a number of fail bits to generate a first counting signal and a second counting signal, wherein the first counting signal and the second counting signal is activated in response to detecting the first reference fail bit and the second reference fail bit, respectively; and
    a bit verification block which generates a reference bit verification signal that is activated in response to a transition of the first counting signal and the second counting signal, wherein the reference bit verification signal is activated in response to at least one of the activation of the first counting signal in a first mode and the activation of the second counting signal in a second mode.

11. The non-volatile semiconductor memory device of claim 9, wherein the first reference fail number in the first mode is greater than the second reference fail number in the second mode.

12. The non-volatile semiconductor memory device of claim 11, wherein the erase voltage is increased step by step in the first mode and the erase voltage is kept at a constant level.

13. A reference fail bit verification circuit, comprising:
    a fail bit counter which counts a number of fail bits to generate a first counting signal and a second counting signal, the first counting signal and the second counting signal being activated in response to the number of fail bits counted; and a bit verification block which generates a reference bit verification signal that is activated in response to a transition of the first counting signal and the second counting signal, wherein the reference bit verification signal is activated in response to at least one of the activation of the first counting signal in a first mode, and the activation of the second counting signal in a second mode;

wherein the bit verification block comprises a fail bit verification unit which generates a setting bit verification signal, the setting bit verification signal being activated in response to a transition of the first counting signal or the second counting signal, wherein the setting bit verification signal is activated in response to at least one of the activation of the first counting signal in the first mode and the activation of the second counting signal in the second mode; and wherein the fail bit verification unit comprises:

a first logic circuit which is enabled in the first mode, wherein the first logic circuit generates an output signal in response to the activation of the first counting signal;

a second logic circuit which is enabled in the second mode, wherein the second logic circuit generates an output signal in response to the activation of the counting signal; and a third logic circuit which performs a logic operation on the output signal of the first logic circuit and the output signal of the second logic circuit.

14. The reference fail bit verification circuit of claim 13, wherein the first logic circuit is a first AND gate which performs an AND operation on a first mode selection signal being enabled in the first mode and the first counting signal, and wherein the second logic circuit is a second AND gate which performs an AND operation on a second mode selection signal being enabled in the second mode and the second counting signal.

* * * * *